US010950451B2

(12) United States Patent
Arakida et al.

(10) Patent No.: US 10,950,451 B2
(45) Date of Patent: Mar. 16, 2021

(54) CUTTING APPARATUS

(71) Applicant: DISCO CORPORATION, Tokyo (JP)

(72) Inventors: Hisashi Arakida, Tokyo (JP); Hiroyuki Hiraga, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/356,068

(22) Filed: Mar. 18, 2019

(65) Prior Publication Data

US 2019/0295850 A1    Sep. 26, 2019

(30) Foreign Application Priority Data

Mar. 20, 2018  (JP) .............................. JP2018-052738

(51) Int. Cl.
| H01L 21/304 | (2006.01) |
| H01L 21/67 | (2006.01) |
| B28D 5/00 | (2006.01) |
| H01L 21/02 | (2006.01) |
| B28D 5/02 | (2006.01) |
| B24B 27/06 | (2006.01) |
| B08B 1/04 | (2006.01) |
| B08B 3/02 | (2006.01) |
| B08B 7/00 | (2006.01) |
| B23K 101/40 | (2006.01) |

(52) U.S. Cl.
CPC ............ H01L 21/3043 (2013.01); B08B 1/04 (2013.01); B08B 3/02 (2013.01); B08B 7/0057 (2013.01); B24B 27/06 (2013.01); B28D 5/0076 (2013.01); B28D 5/02 (2013.01); H01L 21/02043 (2013.01); B23K 2101/40 (2018.08)

(58) Field of Classification Search
CPC .......... H01L 21/2043; H01L 21/67092; H01L 21/3043; B28D 5/0076; B08B 3/02; B32B 38/0004
See application file for complete search history.

(56) References Cited

U.S. PATENT DOCUMENTS

| 5,256,204 A * | 10/1993 | Wu ................... H01L 21/67276 118/719 |
| 2004/0065851 A1* | 4/2004 | Inoue ................ H01L 21/67132 250/504 R |
| 2016/0240415 A1* | 8/2016 | Sekiya ............. H01L 21/67736 |

FOREIGN PATENT DOCUMENTS

| JP | 2003204887 A | 7/2003 |
| JP | 2006295050 A | 10/2006 |

* cited by examiner

*Primary Examiner* — Mark A Osele
*Assistant Examiner* — Christopher C Caillouet
(74) *Attorney, Agent, or Firm* — Greer Burns & Crain Ltd.

(57) ABSTRACT

A cutting apparatus includes a cutting unit that cuts a workpiece included in a frame unit, an ultraviolet ray irradiation unit that irradiates the frame unit with ultraviolet rays, and a control unit. The control unit includes a processing mode registration section in which commands to be output to components. The processing mode registration section registers therein a command in a cutting apparatus mode that causes the cutting unit to cut the workpiece and a command in an ultraviolet ray irradiation apparatus mode that causes the ultraviolet ray irradiation unit to irradiate the frame unit with ultraviolet rays.

6 Claims, 4 Drawing Sheets

CUTTING APPARATUS

BACKGROUND OF THE INVENTION

Field of the Invention

The present invention relates to a cutting apparatus including a cutting unit that cuts a workpiece with a cutting blade.

Description of the Related Art

In a process for fabricating device chips for use in electronic equipment including cellular phones and personal computers, a plurality of crossing scheduled division lines are set on a front surface of a wafer formed of, for example, a semiconductor. Devices, such as integrated circuits (ICs) and large-scale integration circuits (LSIs), are then formed in respective separate regions defined by the scheduled division lines. An adhesive tape called a dicing tape affixed to an annular frame is thereafter affixed to a back surface of the wafer, and the wafer, the adhesive tape, and the annular frame form an integrated frame unit. The wafer included in the frame unit is processed and divided along the scheduled division lines (streets). This forms individual device chips on the adhesive tape.

To divide the wafer, a cutting apparatus, for example, is employed. The cutting apparatus includes, for example, a chuck table, a cutting unit, and a cleaning unit. The chuck table holds the workpiece such as the wafer via the adhesive tape. The cutting unit cuts the workpiece. The cleaning unit cleans the frame unit that includes the cut workpiece. The cutting apparatus further includes a cassette placement unit, a conveyance unit, and a control unit. The cassette placement unit receives a cassette that houses a plurality of frame units. The conveyance unit conveys the frame unit. The control unit controls various components of the cutting apparatus. The adhesive tape used in the frame unit includes an adhesive layer including, for example, an ultraviolet curable resin. The adhesive layer, while exhibiting strong adhesion to the workpiece such as the wafer, cures to reduce the adhesion when irradiated with ultraviolet rays. When the adhesive tape affixed to the workpiece is to be peeled off after cutting has been completed, the adhesive tape is irradiated with the ultraviolet rays to thereby reduce adhesion of the adhesive layer. An ultraviolet ray irradiation apparatus including an ultraviolet light source that emits ultraviolet rays, for example, is used for irradiating the adhesive tape with the ultraviolet rays.

Cutting apparatuses incorporating ultraviolet ray irradiation units have been developed in order to form device chips even more efficiently by eliminating the need to convey the frame unit including the cut workpiece onto an ultraviolet ray irradiation unit (see, for example, Japanese Patent Laid-open No. 2003-204887 and Japanese Patent Laid-open No. 2006-295050). The cutting apparatus incorporating the ultraviolet ray irradiation unit typically works as follows. Specifically, the conveyance unit conveys a frame unit from the cassette loaded in the cassette placement unit onto the chuck table and the cutting unit cuts the workpiece included in the frame unit. The conveyance unit next conveys the frame unit from the chuck table onto the cleaning unit and the cleaning unit cleans the frame unit. The frame unit is then conveyed onto the ultraviolet ray irradiation unit and the adhesive tape is irradiated with the ultraviolet rays. The frame unit is thereafter housed in the cassette.

SUMMARY OF THE INVENTION

A plurality of cutting apparatuses for various purposes are installed in a device chip fabrication factory. The cutting apparatus incorporating an ultraviolet ray irradiation unit costs relatively high and all cutting apparatuses installed in a fabrication factory are not necessarily provided with the ultraviolet ray irradiation units. To cut a workpiece with a cutting apparatus in which an ultraviolet ray irradiation unit is not mounted, the fabrication factory in which this cutting apparatus is installed requires an ultraviolet ray irradiation apparatus that irradiates the adhesive tape with the ultraviolet rays. The installation of an independent ultraviolet ray irradiation apparatus in this fabrication factory, however, results in a limited internal space of the fabrication factory being consumed by the ultraviolet ray irradiation apparatus. Moreover, the ultraviolet ray irradiation apparatus involves additional cost. All this results in reduced productivity of the fabrication factory. It is therefore an object of the present invention to provide a cutting apparatus that can function as an ultraviolet ray irradiation apparatus.

In accordance with an aspect of the present invention, there is provided a cutting apparatus. The cutting apparatus includes: a chuck table that holds a frame unit, the frame unit including an annular frame, an adhesive tape affixed to the annular frame and having adhesion reduced by being irradiated with ultraviolet rays, and a workpiece to which the adhesive tape is affixed; a cutting unit that cuts with a cutting blade the workpiece included in the frame unit held by the chuck table; a cleaning unit that cleans the frame unit including the workpiece cut by the cutting unit; an ultraviolet ray irradiation unit that irradiates the adhesive tape of the frame unit with ultraviolet rays; a cassette placement unit in which a cassette capable of housing the frame unit is placed; a conveyance unit that conveys the frame unit to and from the cassette placed on the cassette placement unit, the chuck table, the cleaning unit, and the ultraviolet ray irradiation unit; and a control unit that controls components including the cutting unit, the cleaning unit, the ultraviolet ray irradiation unit, and the conveyance unit. The control unit includes a processing mode registration section in which a command to be output by the control unit to each of the components in each of a plurality of types of processing that can be performed for the frame unit is registered. The processing mode registration section registers therein: a command in a cutting apparatus mode that causes the cutting unit to cut the workpiece included in the frame unit unloaded from the cassette and held by the chuck table and causes the conveyance unit to convey and load the frame unit including the cut workpiece onto the cassette, and a command in an ultraviolet ray irradiation apparatus mode that causes the ultraviolet ray irradiation unit to irradiate the frame unit unloaded from the cassette with ultraviolet rays, without causing the cutting unit to cut the workpiece included in the frame unit, and that causes the conveyance unit to convey and load onto the cassette the frame unit that has been irradiated with the ultraviolet rays. The control unit has a function that acquires from the processing mode registration section a command corresponding to the processing to be performed for the frame unit and that outputs the command to the corresponding component.

Preferably, the processing mode registration section further registers therein a command in a cleaning apparatus mode that causes the cleaning unit to clean the frame unit unloaded from the cassette, without causing the cutting unit to cut the workpiece included in the frame unit, and that causes the conveyance unit to convey and load the cleaned frame unit onto the cassette.

The cutting apparatus according to the aspect of the present invention includes a cutting unit that can cut a workpiece included in a frame unit; a cleaning unit that can clean the frame unit; and an ultraviolet ray irradiation unit that can irradiate the frame unit with ultraviolet rays. The cutting apparatus further includes a control unit that controls components. The control unit includes a processing mode registration section in which commands corresponding to various types of processing to be performed by the cutting apparatus are registered. The processing mode registration section registers therein a command in a cutting apparatus mode in which the workpiece is cut and a command in an ultraviolet ray irradiation apparatus mode in which the frame unit is irradiated with ultraviolet rays. The control unit acquires from the processing mode registration section a command corresponding to a type of processing scheduled to be performed by the cutting apparatus and outputs the command to a corresponding component to thereby enable the cutting apparatus to perform the various types of processing.

For example, to perform cutting of the workpiece in the cutting apparatus, the control unit acquires from the processing mode registration section a command in the cutting apparatus mode and outputs the command to a corresponding component to thereby enable the cutting apparatus to perform the cutting of the workpiece. To perform irradiation of the frame unit with ultraviolet rays in the cutting apparatus, the control unit acquires from the processing mode registration section a command in the ultraviolet ray irradiation apparatus mode and outputs the command to a corresponding component to thereby enable the cutting apparatus to perform the irradiation of the frame unit with the ultraviolet rays. In the ultraviolet ray irradiation apparatus mode, simply the frame unit is irradiated with the ultraviolet rays and cutting of the workpiece is not performed. Specifically, the cutting apparatus functions as an ultraviolet ray irradiation apparatus when controlled by the ultraviolet ray irradiation apparatus mode. Thus, disposition of the cutting apparatus in a device chip fabrication factory can eliminate the need for the ultraviolet ray irradiation apparatus.

A cutting apparatus is intended for cutting workpieces and the hitherto known cutting apparatuses have not been manufactured so as to be appropriately applicable to any type of processing other than cutting of the workpieces. In the cutting apparatus in one aspect of the present invention, however, the processing mode registration section registers therein the commands corresponding to various types of processing and the control unit outputs a specific command to a corresponding component, so that the cutting apparatus can be appropriately applied a specific type of processing other than cutting. One aspect of the present invention thus provides a cutting apparatus capable of functioning as an ultraviolet ray irradiation apparatus.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
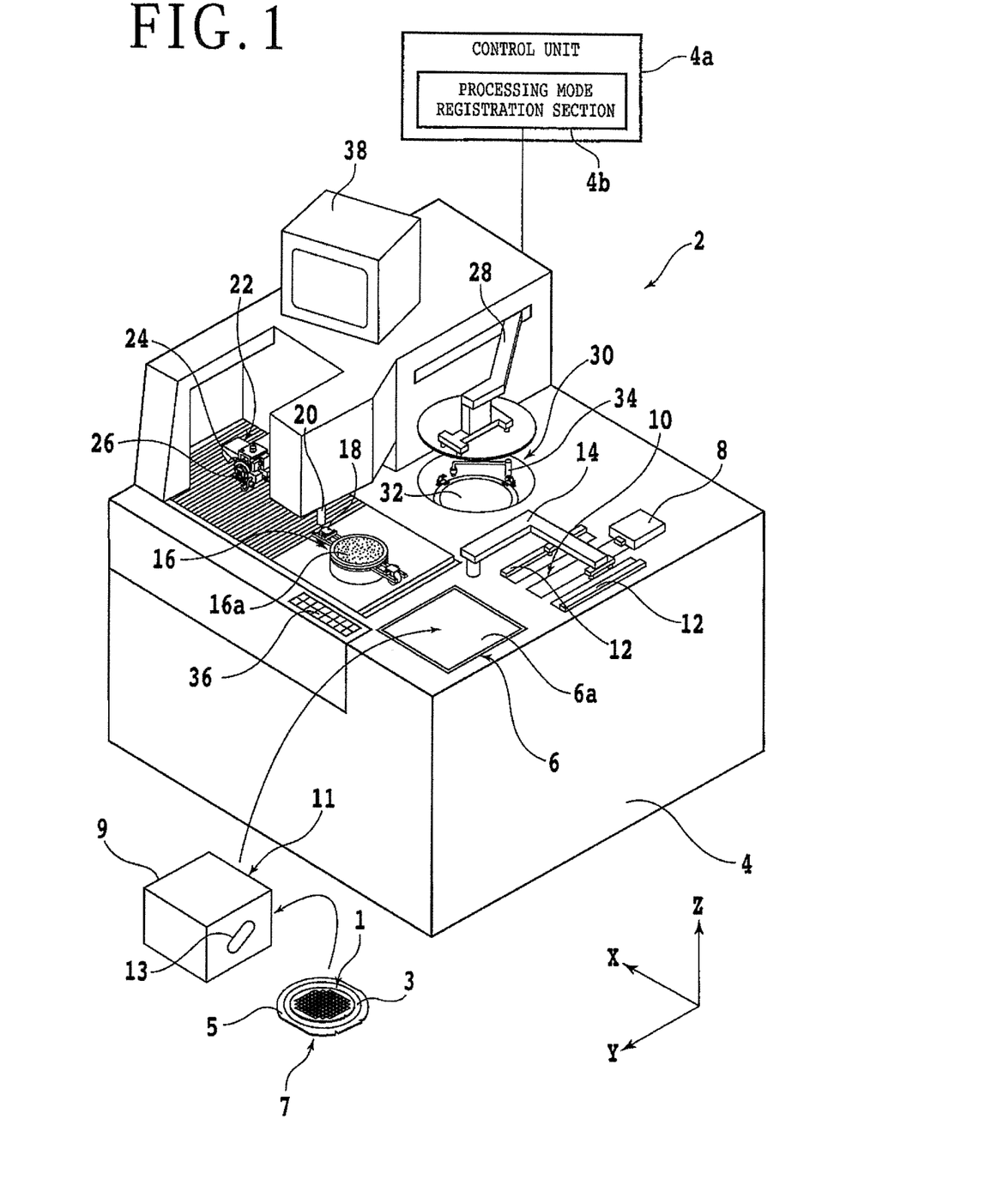
FIG. 1 is a perspective view schematically depicting a cutting apparatus, a cassette, and a frame unit.

An embodiment of the present invention will be described below with reference to the accompanying drawings. A frame unit for which various types of processing are performed by a cutting apparatus according to the present embodiment will first be described. FIG. 1 is a perspective view schematically depicting the cutting apparatus, a cassette, and a frame unit according to the embodiment. This frame unit 7 includes an annular frame 5, an adhesive tape 3, and a workpiece 1. The adhesive tape 3 is affixed to the annular frame 5. The workpiece 1 is affixed by the adhesive tape 3. The adhesive tape 3 is called a dicing tape. The workpiece 1 before and after processing is supported by the adhesive tape 3.

The workpiece 1 is, for example, a wafer formed of silicon, silicon carbide (SiC), or other semiconductor material, or a disc-shaped substrate formed of sapphire, glass, quartz, or the like. As depicted in FIG. 1, the workpiece 1 has a front surface on which a plurality of crossing scheduled division lines, called streets, are formed. Devices, such as integrated circuits (ICs) and light emitting diodes (LEDs), are formed in respective separate regions defined by the scheduled division lines. Dividing the workpiece 1 along the scheduled division lines produces device chips. The individual device chips thus formed are supported by the adhesive tape 3. The device chips are peeled off from the adhesive tape 3 and are eventually mounted on predetermined target objects on which the device chips are to be mounted.

The adhesive tape 3 includes a substrate (not depicted) and an adhesive layer (not depicted). The substrate is formed of, for example, epoxy resin, acrylic resin, synthetic rubber, or polyimide. The adhesive layer includes an ultraviolet curable resin on the substrate. The adhesive layer, while exhibiting strong adhesion to the workpiece 1, cures to reduce the adhesion when irradiated with ultraviolet rays. When the adhesive tape 3 affixed to the workpiece 1 is to be peeled off, the adhesive tape 3 is irradiated with the ultraviolet rays to thereby reduce adhesion of the adhesive layer. The annular frame 5 formed of, for example, metal is affixed to an outer peripheral portion of the adhesive tape 3. In the frame unit 7, the workpiece 1 is affixed to and supported by the adhesive tape 3 inside a through hole in the annular frame 5. The workpiece 1, which is integrated with the adhesive tape 3 and the frame 5 to constitute the frame unit 7, is loaded onto a cutting apparatus 2 and is cut by a cutting blade 24, which is mounted on the cutting apparatus 2. Thereafter, the adhesive tape 3 is peeled off from the back surface side of the device chips formed by cutting.

Components of the cutting apparatus 2 will be described below. As depicted in FIG. 1, a cassette placement unit 6 is disposed at a corner of an apparatus base 4 of the cutting apparatus 2. The cassette placement unit 6 houses a cassette 9. The cassette 9 houses a plurality of frame units 7. The cassette placement unit 6 includes a cassette placement base 6a. The cassette placement base 6a supports the cassette 9. The cassette placement base 6a can be raised or lowered in a vertical direction (Z-axis direction) by an elevator mechanism 48 (see FIG. 2) to be described later. The cassette 9 has a box-shaped housing that has a loading/unloading port 11 in a front face thereof. The frame unit 7 is loaded and unloaded by way of the loading/unloading port 11. Handles 13 are mounted on both lateral faces of the box-shaped housing. A carrier who carries the cassette 9 holds onto the handles 13. A plurality of support frames (not depicted) are formed on inner walls of both lateral face sides of the housing of the cassette 9. The support frames protrude from the respective inner walls toward the inside of the housing. The plurality of support frames are provided in pairs at corresponding heights on both lateral faces of the cassette 9. The frame unit 7 is placed on one pair of the support frames formed on both the lateral faces and housed in the cassette 9.

Loading/unloading means 8, which loads and unloads the frame unit 7 housed inside the cassette 9 supported on the cassette placement base 6a, is disposed on the apparatus base 4 of the cutting apparatus 2. The loading/unloading means 8 includes, for example, a moving portion and a holding portion. The moving portion can move in a Y-axis direction. The holding portion protrudes from the moving portion toward the cassette placement base 6a. When the frame unit 7 is to be loaded in the cutting apparatus 2, the cassette 9 is raised or lowered to thereby align, in the vertical direction, the target frame unit 7 with the loading/unloading means 8 and the loading/unloading means 8 is moved in the Y-axis direction to advance into the cassette 9. The holding portion is then caused to hold the frame unit 7 and the loading/unloading means 8 is moved in the opposite direction in the Y-axis direction. The frame unit 7 is thereby conveyed onto a temporary placement station 10 on the apparatus base 4 and the holding of the frame unit 7 by the holding portion is canceled.

A pair of bar-shaped positioning means 12 is disposed on the apparatus base 4. The positioning means 12 are disposed on opposite sides of the temporary placement station 10. The positioning means 12 extend in the Y-axis direction and are movable in the X-axis direction so as to approach each other. The positioning means 12 clamp the frame unit 7 on the temporary placement station 10 to thereby position the frame unit 7 at a predetermined position. Conveyance means 14 is disposed between the temporary placement station 10 on the apparatus base 4 and a chuck table 16 to be described later. The conveyance means 14 includes a shaft portion connected with the apparatus base 4, an arm portion extending in a horizontal direction from an upper portion of the shaft portion, and a holding portion at a distal end of the arm portion. The conveyance means 14 works as follows. Specifically, the holding portion holds the frame unit 7 on the temporary placement station 10 and the shaft portion is rotated to thereby rotate the arm portion, so that the frame unit 7 is moved to a position on the chuck table 16.

The chuck table 16 is disposed on the upper surface of the apparatus base 4. The chuck table 16 holds the frame unit 7, which includes the workpiece 1 to be cut. The chuck table 16 includes a porous member, a suction path (not depicted), and a suction source (not depicted). The porous member is exposed to the upper surface. The suction path communicates with the porous member. The suction source is connected with a proximal end side of the suction path. When the suction source is operated, vacuum acts on the frame unit 7 on the chuck table 16, and the frame unit 7 is sucked and held by the chuck table 16. Specifically, the upper surface of the chuck table 16 assumes a holding surface 16a. A clamp 18 is disposed on the outer peripheral side of the holding surface 16a of the chuck table 16. The clamp 18 holds the frame 5 included in the frame unit 7. The chuck table 16 is rotatable about an axis extending in a direction perpendicular to the holding surface 16a.

The cutting apparatus 2 includes an X-axis moving mechanism (not depicted) that moves the chuck table 16 in the X-axis direction. The chuck table 16, while holding the frame unit 7, moves in the X-axis direction to thereby convey the frame unit 7 onto a processing area in which the workpiece 1 included in the frame unit 7 is cut. An imaging camera 20 is disposed at a position superior to a path along which the frame unit 7 advances into the processing area. The imaging camera 20 captures an image of the workpiece 1 on the chuck table 16, which moves along the path below the imaging camera 20. The cutting apparatus 2 performs alignment procedures for an orientation of the workpiece 1 and a position of a cutting unit 22 to be described later so that the workpiece 1 can be cut along the scheduled division lines of the workpiece 1.

The cutting unit 22, which cuts the workpiece 1 on the chuck table 16, is disposed above the processing area. The cutting unit 22 includes a spindle 26 and the annular cutting blade 24. The spindle 26 extends in the Y-axis direction. The cutting blade 24 is mounted at a distal end of the spindle 26. The spindle 26 can be rotated about the Y-axis direction by rotation means (not depicted) such as a motor. The rotation of the spindle 26 enables the cutting blade 24 to be rotated. Additionally, the cutting unit 22 can be raised and lowered in the Z-axis direction by an elevator mechanism not depicted and can be advanced and retracted in the Y-axis direction by an advance/retract mechanism not depicted. When the workpiece 1 is to be cut, the cutting unit 22 is lowered such that a lower end of the cutting blade 24 is lower in height than a lower end of the workpiece 1 and the chuck table 16 is moved in the X-axis direction while the cutting blade 24 is being rotated. Then, the cutting blade 24 cuts into the workpiece 1 so that the workpiece 1 is cut.

A cleaning unit 30 is disposed on the upper surface of the apparatus base 4. The cleaning unit 30 cleans the frame unit 7 including the cut workpiece 1. The cutting apparatus 2 includes conveyance means 28, which conveys the frame unit 7 from the chuck table 16 onto the cleaning unit 30. The cleaning unit 30 includes a cleaning table 32 and a cleaning nozzle 34. The frame unit 7 is placed on the cleaning table 32. The cleaning nozzle 34 supplies the frame unit 7 on the cleaning table 32 with a cleaning solution to thereby clean the frame unit 7. The cleaning nozzle 34 is a pipe-shaped member. The cleaning nozzle 34 includes a shaft portion, an arm portion, and a jet port. The shaft portion extends in the Z-axis direction from a position on an outer peripheral side of the cleaning table 32. The arm portion extends from an upper end of the shaft portion over a length to reach a central portion of the cleaning table 32. The jet port is disposed at a distal end of the arm portion. The frame unit 7 is cleaned when the frame unit 7 is placed on the cleaning table 32 and the shaft portion is rotated while the cleaning solution is jetted out from the jet port.

Figure 2:
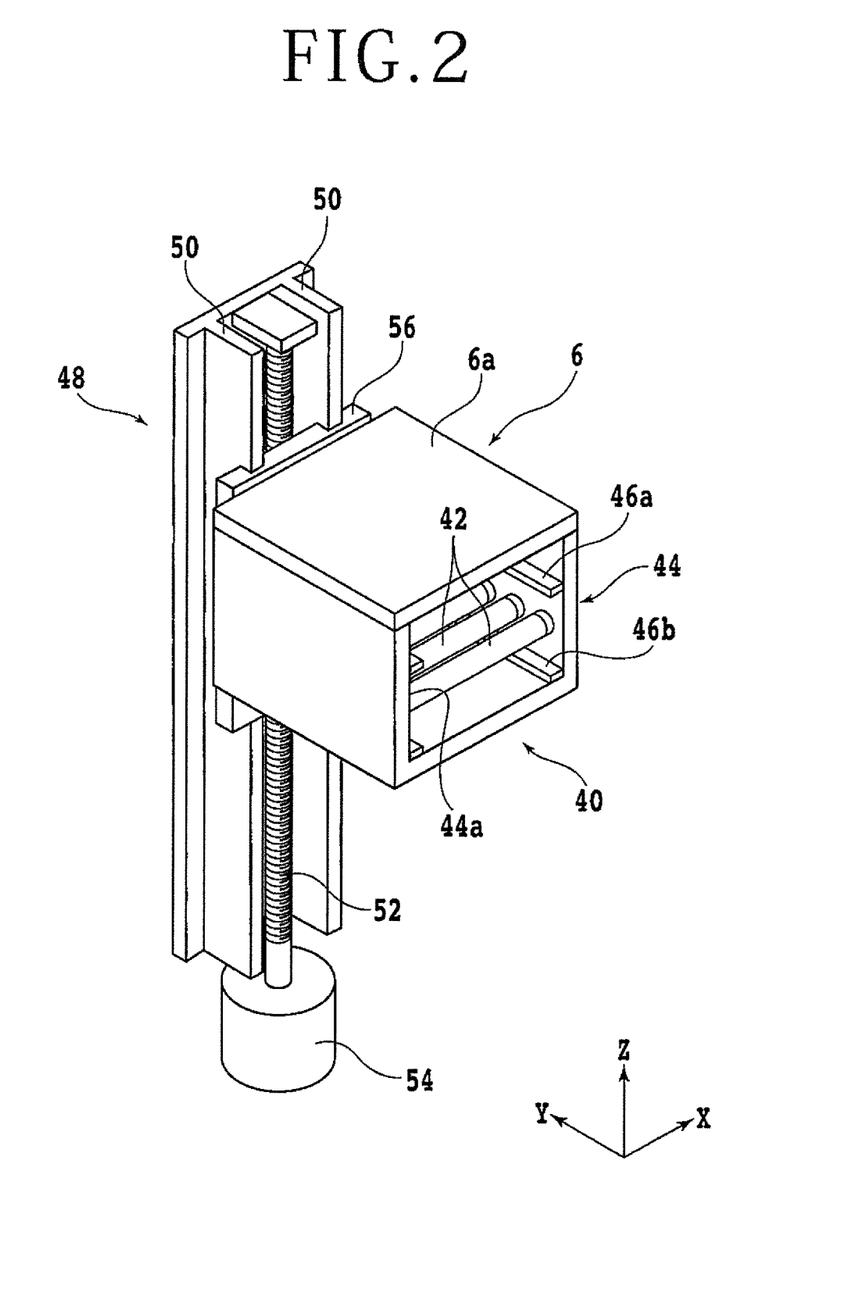
FIG. 2 is a perspective view schematically depicting a cassette placement unit and an ultraviolet ray irradiation unit.

It is noted that the loading/unloading means 8, the conveyance means 14, and the conveyance means 28 each function as a conveyance unit involved in conveyance of the frame unit 7. As depicted in FIG. 2, an ultraviolet ray irradiation unit 40 is disposed at a lower portion of the cassette placement base 6a. FIG. 2 is a perspective view schematically depicting the ultraviolet ray irradiation unit 40. The frame unit 7, which has been cleaned by the cleaning unit 30, is conveyed onto the ultraviolet ray irradiation unit 40 by the conveyance unit.

As depicted in FIG. 2, the elevator mechanism 48, which raises and lowers the cassette placement base 6a and the ultraviolet ray irradiation unit 40, is disposed inside the apparatus base 4. The frame unit 7, when to be loaded in and unloaded from the ultraviolet ray irradiation unit 40, is exposed superiorly to the apparatus base 4 by the elevator mechanism 48. The ultraviolet ray irradiation unit 40 includes a box-shaped housing 44 and a pair of support frames 46a. The housing 44 has a loading/unloading port 44a formed therein. The frame unit 7 is loaded and unloaded along the Y-axis direction via the loading/unloading port 44a. The support frames 46a each protrude toward the inside from a position near a center of a side wall of the housing 44 and extend along the Y-axis direction. A pair of support frames 46b is disposed inside the housing 44. The support frames 46b are each disposed at a corner at which a bottom wall of the housing 44 meets a side wall of the housing 44. A plurality of ultraviolet light sources 42 are disposed at a position in the vertical direction between the support frames 46a and the support frames 46b inside the housing 44.

The frame unit 7, which is to be irradiated with ultraviolet rays by the ultraviolet ray irradiation unit 40, is loaded onto either the pair of support frames 46a or the pair of support frames 46b. The frame unit 7, when loaded onto the pair of support frames 46a, can be irradiated with the ultraviolet rays from the back surface side thereof. The frame unit 7, when loaded onto the pair of support frames 46b, can be irradiated with the ultraviolet rays from the front surface side thereof. The irradiation of the frame unit 7 with the ultraviolet rays from the back surface side cures the adhesive tape 3 included in the frame unit 7 to thereby reduce adhesion to the workpiece 1, so that the adhesive tape 3 can be easily peeled off from the workpiece 1. The irradiation of the frame unit 7 with the ultraviolet rays from the front surface side modifies the front surface side of the workpiece 1; for example, the surface can be turned to be hydrophilic.

Figure 3:
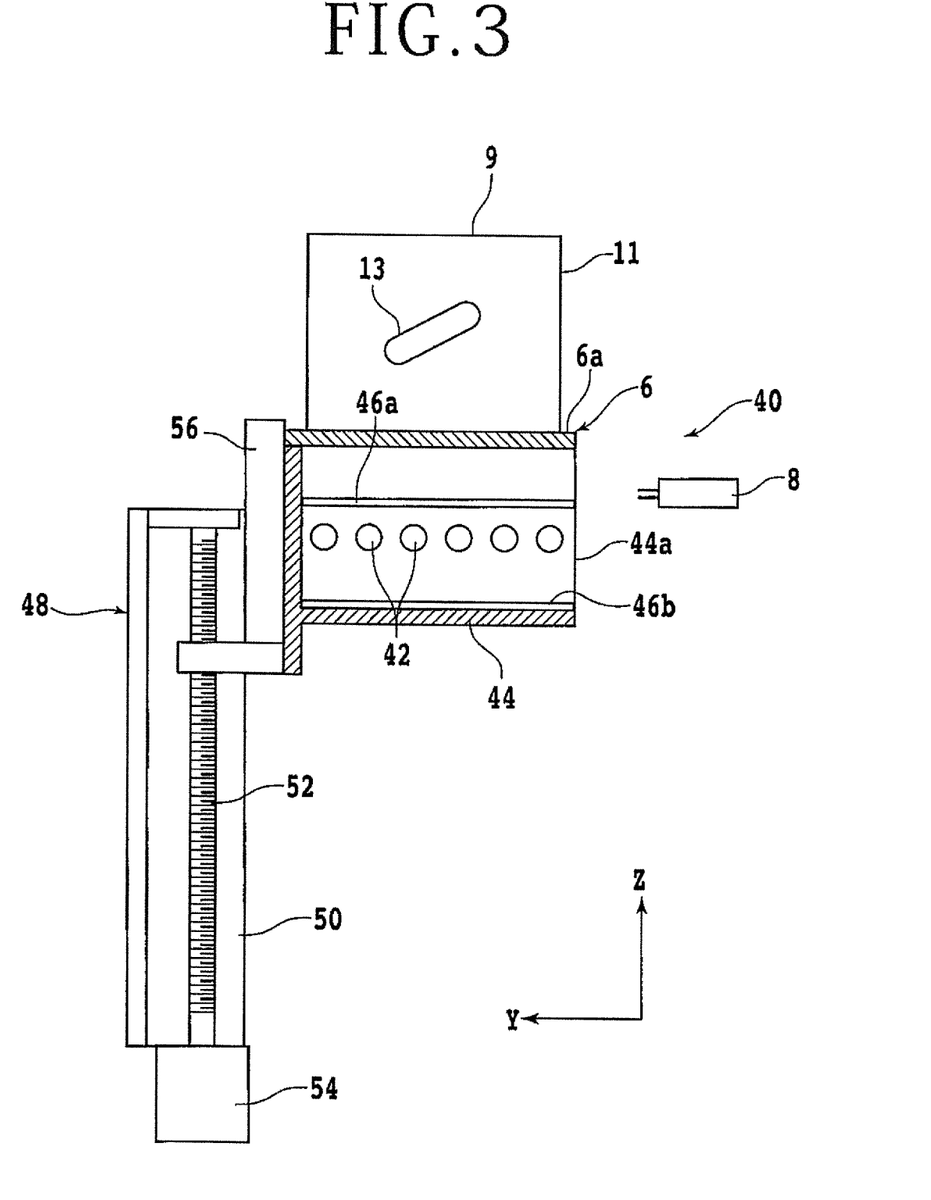
FIG. 3 is a cross-sectional view schematically depicting the cassette placement unit and the ultraviolet ray irradiation unit.

A moving plate 56 is disposed on the back surface side of the housing 44 of the ultraviolet ray irradiation unit 40. The moving plate 56 is supported slidably on the elevator mechanism 48. The ultraviolet ray irradiation unit 40 and the cassette placement unit 6 are supported on the elevator mechanism 48 via the moving plate 56. The elevator mechanism 48 includes a pair of guide rails 50, a ball screw 52, and a pulse motor 54. The guide rails 50 extend along the Z-axis direction. The ball screw 52 is disposed between the guide rails 50. The pulse motor 54 is connected with a lower end side of the ball screw 52 and rotates the ball screw 52. Raising and lowering of the ultraviolet ray irradiation unit 40 and the like by the elevator mechanism 48 will be described below. FIG. 3 is a cross-sectional view schematically depicting the cassette placement unit 6 and the ultraviolet ray irradiation unit 40. A nut portion that is threadedly engaged with the ball screw 52 is disposed at a lower portion on the back surface of the moving plate 56. Rotating the pulse motor 54 to thereby rotate the ball screw 52 causes the moving plate 56, which supports the ultraviolet ray irradiation unit 40 and the cassette placement unit 6, to move in the vertical direction along the Z-axis direction.

FIG. 3 depicts a positional relation in height between the ultraviolet ray irradiation unit 40 and the loading/unloading means 8 when the frame unit 7 is to be loaded onto the support frames 46a of the housing 44. To irradiate the frame unit 7 with ultraviolet rays from the back surface side, the support frames 46a of the ultraviolet ray irradiation unit 40 are aligned in height with the loading/unloading means 8 using the elevator mechanism 48 as depicted in FIG. 3. The frame unit 7, which has been irradiated with ultraviolet rays by the ultraviolet ray irradiation unit 40, is pulled out of the housing 44 by the loading/unloading means 8. The elevator mechanism 48 thereafter aligns a predetermined housing position of the cassette 9 with the height of the loading/unloading means 8 and the loading/unloading means 8 loads the frame unit 7 onto the predetermined housing position via the loading/unloading port 11 of the cassette 9.

The cutting apparatus 2 will further be described with reference to FIG. 1. Input means 36 is disposed on one end of an upper surface of the apparatus base 4 of the cutting apparatus 2. The input means 36 inputs, for example, various types of instructions in the cutting apparatus 2. In addition, a display monitor 38 is disposed at an upper portion of the apparatus base 4. The display monitor 38 displays, for example, screens indicating progress statuses of processing performed by the cutting apparatus 2, details of the processing, and warning and operation. An operator who operates the cutting apparatus 2 operates the cutting apparatus 2 with the input means 36, while viewing the screens displayed on the display monitor 38. The cutting apparatus 2 further includes a control unit 4a. The control unit 4a controls various components of the cutting apparatus 2 including the cutting unit 22, the cleaning unit 30, the ultraviolet ray irradiation unit 40, and the conveyance units. The control unit 4a controls, for example, the cassette placement unit 6, the conveyance units, the cutting unit 22, the cleaning unit 30, the ultraviolet ray irradiation unit 40, and the elevator mechanism 48 by outputting commands thereto.

The control unit 4a includes a processing mode registration section 4b. The processing mode registration section 4b registers a command to be output by the control unit 4a to each of the components in each of a plurality of types of processing to be performed by the cutting apparatus 2 on the frame unit 7. The control unit 4a acquires from the processing mode registration section 4b a command corresponding to a specific type of processing to be performed on the frame unit 7 and outputs the command to the corresponding component. The processing mode registration section 4b registers therein not only a command relating to cutting by the cutting unit 22 of the workpiece 1 included in the frame unit 7, but also commands relating to other types of processing. Examples of the types of processing to be registered include, but are not limited to, a command relating to irradiation of the frame unit 7 with ultraviolet rays not involving cutting of the workpiece 1 and a command relating to cleaning of the frame unit 7 not involving cutting of the workpiece 1.

A hitherto known cutting apparatus has been engineered for cutting workpieces and an ultraviolet ray irradiation unit mounted in the cutting apparatus processes a frame unit that includes the workpiece cut by a cutting unit. Specifically, the ultraviolet ray irradiation unit is not intended for use in irradiating with ultraviolet rays a workpiece cut by another cutting apparatus different from the hitherto known cutting apparatus and a workpiece that is yet to be cut. Thus, an appropriate application of the hitherto known cutting apparatus including the ultraviolet ray irradiation unit to only the irradiation of the frame unit with ultraviolet rays is not easy and forcing the hitherto known cutting apparatus to the irradiation of the ultraviolet rays may cause the cutting apparatus to develop an unexpected fault. In contrast, in the cutting apparatus 2 in the present embodiment, the control unit 4a includes the processing mode registration section 4b and a command in, for example, an ultraviolet ray irradiation apparatus mode in which only the irradiation of ultraviolet rays is to be performed is registered in the processing mode registration section 4b. The control unit 4a then acquires the command from the processing mode registration section 4b and outputs the command to a corresponding component. Thus, the cutting apparatus 2 can function as an ultraviolet ray irradiation apparatus, so that the cutting apparatus 2 can appropriately irradiating the frame unit 7 including the workpiece 1 not cut by the cutting apparatus 2 with ultraviolet rays.

Figure 4A:
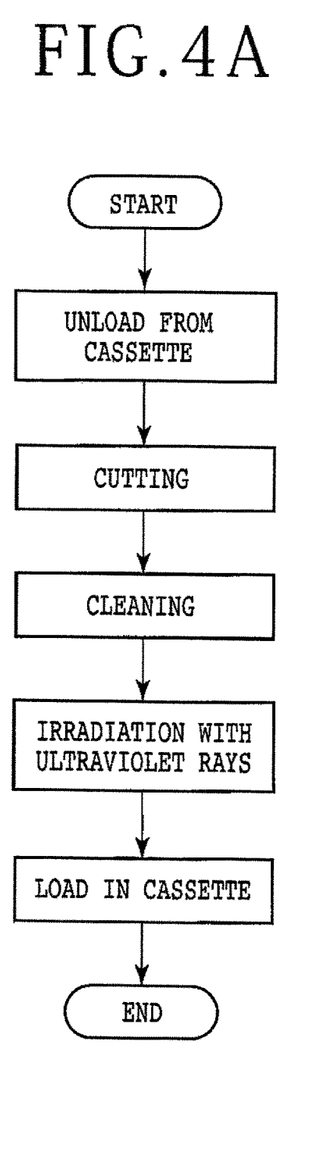
FIG. 4A is a flowchart illustrating a cutting apparatus mode.
Figure 4B:
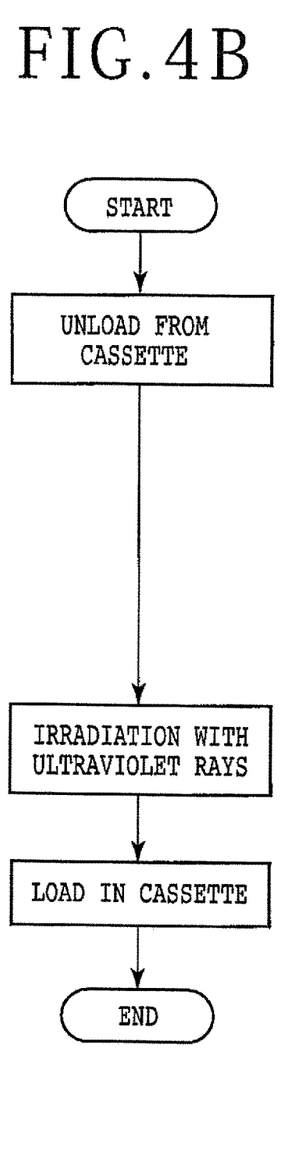
FIG. 4B is a flowchart illustrating an ultraviolet ray irradiation apparatus mode.
Figure 4C:
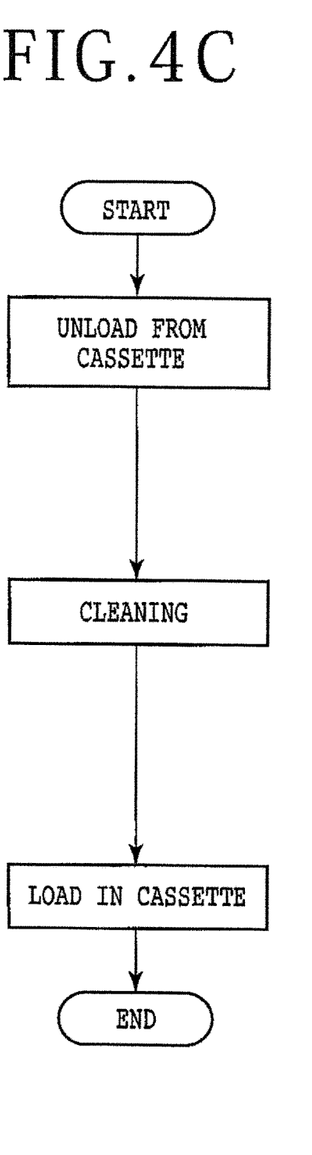
FIG. 4C is a flowchart illustrating a cleaning apparatus mode.

Examples of commands registered in the processing mode registration section 4b will be described. FIG. 4A is a flowchart illustrating a cutting apparatus mode. FIG. 4B is a flowchart schematically illustrating an ultraviolet ray irradiation apparatus mode. FIG. 4C is a flowchart schematically illustrating a cleaning apparatus mode.

Commands in the cutting apparatus mode will first be described with reference to FIG. 4A. The cutting apparatus mode refers to a mode in which the cutting apparatus 2 functions as a cutting apparatus. Types of processing performed in the cutting apparatus mode include cutting by the cutting unit 22, cleaning by the cleaning unit 30, and irradiation of ultraviolet rays by the ultraviolet ray irradiation unit 40. In the cutting apparatus mode, the control unit 4a first controls the elevator mechanism 48 and the loading/unloading means 8 to thereby unload the frame unit 7 from the cassette 9. The control unit 4a next controls the positioning means 12 and the conveyance means 14 thereby to place the frame unit 7 on the holding surface 16a of the chuck table 16 and to allow the chuck table 16 to hold the frame unit 7. The control unit 4a then controls the X-axis moving mechanism and the cutting unit 22 to thereby cause the cutting unit 22 to cut the workpiece 1 included in the frame unit 7.

The control unit 4a thereafter controls the conveyance means 28 to thereby convey the frame unit 7 from the chuck table 16 onto the cleaning table 32 and controls the cleaning unit 30 to clean the workpiece 1. Additionally, the control unit 4a controls the elevator mechanism 48, the conveyance means 14, and the loading/unloading means 8 to thereby load the frame unit 7 onto the ultraviolet ray irradiation unit 40 and controls the ultraviolet ray irradiation unit 40 to thereby irradiate the frame unit 7 with ultraviolet rays. The control unit 4a then controls the elevator mechanism 48 and the loading/unloading means 8 to thereby load the frame unit 7 including the cut workpiece 1 onto the cassette 9. To cause the cutting apparatus 2 to function as a cutting apparatus, the control unit 4a acquires a command corresponding to the cutting apparatus mode from the processing mode registration section 4b and outputs the command to the corresponding component.

It is noted that, in the cutting apparatus mode, the frame unit 7 may be irradiated with ultraviolet rays from the front surface side thereof before the frame unit 7 is placed on the holding surface 16a of the chuck table 16, to thereby make the workpiece 1 hydrophilic. In this case, the control unit 4a controls the elevator mechanism 48 and the loading/unloading means 8 to thereby load the frame unit 7 onto the pair of support frames 46b of the ultraviolet ray irradiation unit 40, thereby allowing the front surface side of the frame unit 7 to be irradiated with ultraviolet rays. When the frame unit 7 is to be loaded again in the ultraviolet ray irradiation unit 40 after the front surface of the workpiece 1 has been irradiated with ultraviolet rays and the workpiece 1 has been cut and cleaned, the frame unit 7 is loaded onto the support frames 46a and is irradiated with ultraviolet rays from the back surface side. As a command corresponding to the cutting apparatus mode, a command causing the front surface side of the workpiece 1 to be irradiated with ultraviolet rays before the workpiece 1 is cut may be registered in the processing mode registration section 4b.

Commands in the ultraviolet ray irradiation apparatus mode will be described with reference to FIG. 4B. The ultraviolet ray irradiation apparatus mode refers to a mode in which the cutting apparatus 2 functions as an ultraviolet ray irradiation apparatus. In the ultraviolet ray irradiation apparatus mode, the ultraviolet ray irradiation unit 40 performs the irradiation with ultraviolet rays. In the ultraviolet ray irradiation apparatus mode, the control unit 4a first controls the elevator mechanism 48 and the loading/unloading means 8 to thereby unload the frame unit 7 from the cassette 9. The control unit 4a next controls the elevator mechanism 48 to thereby raise the ultraviolet ray irradiation unit 40, controls the loading/unloading means 8 to thereby load the frame unit 7 in the housing 44, and controls the ultraviolet ray irradiation unit 40 to thereby irradiate the frame unit 7 with ultraviolet rays. The control unit 4a thereafter controls the loading/unloading means 8 to thereby unload the frame unit 7 from the ultraviolet ray irradiation unit 40, controls the elevator mechanism 48 to thereby lower the ultraviolet ray irradiation unit 40, and controls the loading/unloading means 8 to thereby load the frame unit 7, which has been irradiated with ultraviolet rays, onto the cassette 9.

To cause the cutting apparatus 2 to function as an ultraviolet ray irradiation unit, the control unit 4a acquires a command corresponding to the ultraviolet ray irradiation apparatus mode from the processing mode registration section 4b and outputs the command to the corresponding component. In the ultraviolet ray irradiation apparatus mode, the workpiece 1 included in the frame unit 7 is not cut by the cutting unit 22. It is here noted that, in the ultraviolet ray irradiation apparatus mode, the frame unit 7 may be loaded onto the pair of support frames 46a or the pair of support frames 46b when the frame unit 7 is to be loaded in the ultraviolet ray irradiation unit 40. The frame unit 7, when loaded onto the pair of support frames 46a, can be irradiated with ultraviolet rays from the back surface side thereof. The frame unit 7, when loaded onto the pair of support frames 46b, can be irradiated with ultraviolet rays from the front surface side thereof. As a command corresponding to the ultraviolet ray irradiation apparatus mode, the command causing the frame unit 7 to be loaded onto at least either one of the pair of support frames 46a and the pair of support frames 46b and causing the frame unit 7 to be irradiated with ultraviolet rays is registered in the processing mode registration section 4b.

Additionally, the cutting apparatus 2 can also function as a cleaning apparatus that performs only cleaning by the cleaning unit 30. Commands in the cleaning apparatus mode will be described with reference to FIG. 4C. In the cleaning apparatus mode, cleaning by the cleaning unit 30 is performed. In the cleaning apparatus mode, the control unit 4a first controls the elevator mechanism 48 and the loading/unloading means 8 to thereby unload the frame unit 7 from the cassette 9. The control unit 4a next controls the conveyance unit to thereby convey the frame unit 7 onto the cleaning unit 30. Thereafter, the control unit 4a controls the cleaning unit 30 to thereby clean the frame unit 7 and controls the conveyance unit to thereby convey the cleaned frame unit 7 from the cleaning unit 30 onto the cassette 9. To cause the cutting apparatus 2 to function as a cleaning apparatus, the control unit 4a acquires a command corresponding to the cleaning apparatus mode from the processing mode registration section 4b and outputs the command to the corresponding component. It is noted that, in the cleaning apparatus mode, the workpiece 1 included in the frame unit 7 is not cut by the cutting unit 22.

As described above, in the cutting apparatus 2 according to the present embodiment, a command corresponding to a specific type of processing is registered in the processing mode registration section 4b and the control unit 4a outputs the command to the corresponding component. Types of processing other than cutting can thus be appropriately performed. Thus, the present embodiment provides the cutting apparatus 2 that can function as an ultraviolet ray irradiation apparatus and a cleaning apparatus.

It should be noted that the present invention is not limited to the above-described embodiment and may be embodied in various modifications. For example, the above embodiment, which has been described for a case in which the control unit 4a controls different components to thereby enable each mode to be individually performed, is illustrative only and not limiting. Specifically, the control unit 4a may control the components such that two or more modes are performed simultaneously. For example, the cutting apparatus 2, while performing processing in the cutting apparatus mode for a first workpiece, may perform processing in the ultraviolet ray irradiation apparatus mode for a second workpiece. More specifically, the control unit 4a may cause the second workpiece to be loaded in the ultraviolet ray irradiation unit 40 and to be irradiated with ultraviolet rays, while causing the cutting unit 22 to cut the first workpiece. In this case, the cutting apparatus 2 achieves extremely high efficiency in processing.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus, comprising:
   a base;
   a chuck table that holds a frame unit, the frame unit including an annular frame, an adhesive tape affixed to the annular frame and having adhesion reduced by being irradiated with ultraviolet rays, and a workpiece to which the adhesive tape is affixed;
   a cutting unit on said base that cuts with a cutting blade the workpiece included in the frame unit held by the chuck table;
   a cleaning unit on said base that cleans the frame unit including the workpiece cut by the cutting unit;
   an ultraviolet ray irradiation unit on said base that irradiates the adhesive tape of the frame unit with ultraviolet rays;
   a cassette placement unit in which a cassette is configured to house a plurality of the frame units;
   a conveyance unit that conveys the frame unit to and from the cassette placed on the cassette placement unit, the chuck table, the cleaning unit, and the ultraviolet ray irradiation unit; and
   a control unit that controls components including the cutting unit, the cleaning unit, the ultraviolet ray irradiation unit, and the conveyance unit,
   wherein the control unit includes a processing mode registration section, which registers an output command to be output by the control unit to each of the components,
   wherein the processing mode registration section registers therein:
      a first command corresponding with a cutting apparatus mode, wherein the cutting apparatus mode causes:
         the cutting unit to cut the workpiece included in the frame unit unloaded from the cassette and held by the chuck table,
         the cleaning unit to clean the workpiece included in the frame unit,
         the ultraviolet ray irradiation unit to irradiate the workpiece included in the frame unit, with ultraviolet rays,
         and the conveyance unit to convey and load the frame unit including the cut workpiece onto the cassette, and
      a second command, which is different from said first command, corresponding with an ultraviolet ray irradiation apparatus mode, wherein the ultraviolet ray irradiation apparatus mode causes the ultraviolet ray irradiation unit to irradiate the frame unit unloaded from the cassette with ultraviolet rays, without causing the cutting unit to cut the workpiece included in the frame unit, and causes the conveyance unit to convey and load onto the cassette, the frame unit that has been irradiated with the ultraviolet rays, and
   the control unit acquires from the processing mode registration section, the output command, which includes the first command or the second command, the output command corresponding to the processing to be performed for the frame unit and outputs the output command to the corresponding component.

2. The cutting apparatus according to claim 1, wherein the processing mode registration section further registers a third command corresponding with a cleaning apparatus mode that causes the cleaning unit to clean the frame unit unloaded from the cassette, without causing the cutting unit to cut the workpiece included in the frame unit, and that causes the conveyance unit to convey and load the cleaned frame unit onto the cassette; and
   the control unit acquires from the processing mode registration section, the output command, which includes the first command, the second command or the third command, the output command corresponding to the processing to be performed for the frame unit and outputs the output command to the corresponding component.

3. The cutting apparatus according to claim 1, wherein the cassette is configured to receive a plurality of the frame units.

4. The cutting apparatus according to claim 1, wherein the ultraviolet ray irradiation unit is mounted in the cassette placement unit.

5. The cutting apparatus according to claim 4, wherein the cassette placement unit includes support frames configured for supporting the frame unit and the ultraviolet ray irradiation unit includes a plurality of ultraviolet light sources disposed between the support frames.

6. The cutting apparatus according to claim 1, wherein the control unit simultaneously acquires from the processing mode registration section, a first output command that includes the first command, and a second output command that includes the second command, the first and second output commands corresponding to the processing to be performed for at least two frame units and outputs the first and second output commands to the corresponding components.

* * * * *